(12) United States Patent
Haroun et al.

(10) Patent No.: US 8,373,504 B2
(45) Date of Patent: Feb. 12, 2013

(54) CLASS D POWER AMPLIFIER

(75) Inventors: Baher Haroun, Allen, TX (US);
Joonhoi Hur, Dallas, TX (US); Lei Ding, Plano, TX (US); Rahmi Hezar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/106,611

(22) Filed: May 12, 2011

(65) Prior Publication Data
US 2012/0286868 A1 Nov. 15, 2012

(51) Int. Cl.
*H03F 3/217* (2006.01)
(52) U.S. Cl. .................. 330/251; 330/207 A
(58) Field of Classification Search .............. 330/10, 330/207 A, 251
See application file for complete search history.

(56) References Cited

U.S. PATENT DOCUMENTS

| | | | | |
|---|---|---|---|---|
| 3,239,771 A | * | 3/1966 | Andreatta | 330/251 |
| 5,306,986 A | * | 4/1994 | Siao | 315/248 |
| 5,747,935 A | * | 5/1998 | Porter et al. | 315/111.51 |
| 6,552,610 B1 | * | 4/2003 | Grebennikov et al. | 330/251 |
| 7,786,798 B2 | * | 8/2010 | McMorrow | 330/251 |
| 2001/0028272 A1 | * | 10/2001 | Delano | 330/251 |
| 2006/0280314 A1 | * | 12/2006 | Okada et al. | 381/71.1 |
| 2008/0116974 A1 | * | 5/2008 | McMorrow | 330/251 |
| 2010/0289578 A1 | | 11/2010 | Cao | |
| 2011/0051842 A1 | | 3/2011 | van der Heijden et al. | |
| 2011/0193416 A1 | * | 8/2011 | Campanella et al. | 307/104 |

OTHER PUBLICATIONS

"A Switched-Capacitor Power Amplifier for EER/Polar Transmitters," IEEE Intl, Solid-State Circuits Conference Digest of Technical Papers (ISSCC) Feb. 20-24, 2011, pp. 428-430 (Sang-Min Yoo, Jeffrey S. Walling, Eum Chan Woo, David J. Allstot).
"Output Voltage Control by Frequency Regulation in Class-DE Power Amplifier," EUROCON 2007, Sep. 9-12, pp. 1423-1428 (Juliusz Modzelewski*, Miroslaw Mikolajewski).

* cited by examiner

*Primary Examiner* — Henry Choe
(74) *Attorney, Agent, or Firm* — Alan A. R. Cooper; Wade J. Brady, III; Frederick J. Telecky, Jr.

(57) ABSTRACT

A class D power amplifier (PA) is provided. The PA generally comprises a driver, output capacitor, a matching network, and a cancellation circuit. The driver has an input, an output, and a parasitic capacitance, and the input of the driver is configured to receive complementary first and second radio frequency (RF) signals, where there is a free-fly interval between consecutive pulses from the first and second RF signals. The output capacitor and cancellation circuit are each coupled to the output of the driver such that the cancellation circuit provides harmonic restoration at least during the free-fly interval, and the matching network is coupled to the output capacitor.

30 Claims, 6 Drawing Sheets

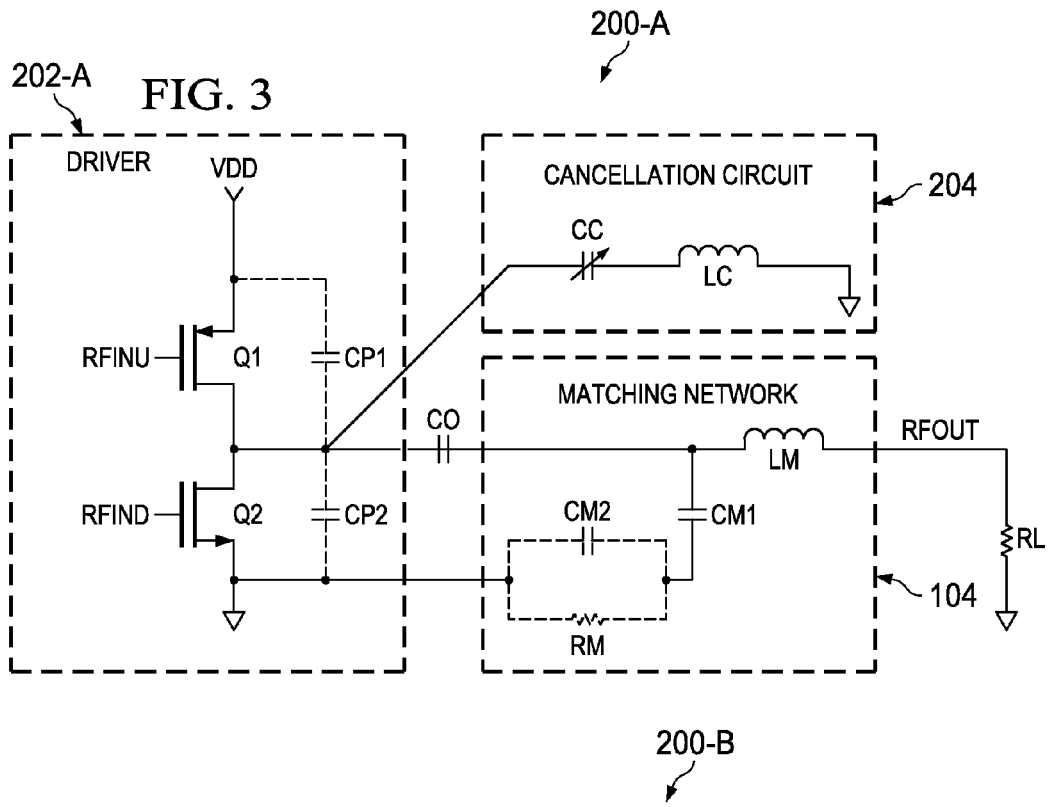

CLASS D POWER AMPLIFIER

TECHNICAL FIELD

The invention relates generally to power amplifiers (PAs) and, more particularly, to class D PAs.

BACKGROUND

Turning to FIG. 1, an example of a conventional class D PA 100 that is capable of amplitude modulation can be seen. This PA 100 generally comprises drivers 102-1 to 102-N (which are typically inverters), capacitors CI1 to CIN, and a matching network 104. In operation, a predetermined number of capacitors (i.e., capacitor CI1 to CIn) are switched, while the remainder (i.e., capacitors CI(n+1) to CIN) are left "off." This generates an effective capacitance CIEFF that is the sum of the switched capacitor (i.e., CIEFF=CI1+ . . . +CIn) and an effective supply voltage VEFF (i.e., VEFF=VDD*(n/N)). A functionally equivalent circuit having an inverter 106 that represents the drivers 102-1 to 102-N and that includes the effective capacitance CIEFF and effective supply voltage VEFF can be seen in FIG. 2. This allows a output radio frequency (RF) signal RFOUT to be generated from an input RF signal RFIN (which can be amplitude modulated) so as to be applied to the load RL.

A problem with this configuration, however, is that the switching losses is a function of the effective capacitance CIEFF and frequency. These losses can be so significant so as to be prohibitive for many applications, and the efficiency can be very low. In particular, the efficiency of PA 100 is only about 37.368%. Therefore, there is a need for an improved class D PA.

Some other conventional circuits are: Yoo et al., "A Switched-Capacitor Power Amplifier for EER/Polar Transmitters," *IEEE Intl, Solid-State Circuits Conference Digest of Technical Papers (ISSCC)* 2011, Feb. 20-24, 2011, pp. 428-430; Modzelewski et al., "Output Voltage Control by Frequency Regulation in Class-DE Power Amplifier," EUROCON 2007, Sep. 9-12, 2007, pp. 1423-1428; U.S. Patent Pre-Grant Publ. No. 2010/0289578; and U.S. Patent Pre-Grant Publ. No. 2011/0051842.

SUMMARY

An embodiment of the present invention, accordingly, provides an apparatus. The apparatus comprises a driver having an input, an output, and a parasitic capacitance, wherein the input of the driver is configured to receive complementary first and second radio frequency (RF) signals, and wherein there is a free-fly interval between consecutive pulses from the first and second RF signals, and wherein the parasitic capacitance of the driver creates switching losses; an output capacitor that is coupled to the output of the driver; a matching network that is coupled to the output capacitor; and a cancellation circuit that is coupled to the output of the driver so as to provide harmonic restoration at least during the free-fly interval.

In accordance with an embodiment of the present invention, the cancellation circuit is an active circuit.

In accordance with an embodiment of the present invention, the cancellation circuit is a passive circuit.

In accordance with an embodiment of the present invention, the cancellation circuit is a tunable inductor-capacitor (LC) circuit.

In accordance with an embodiment of the present invention, wherein the driver further comprises: a first transistor having a first passive electrode, a second passive electrode, and a control electrode, wherein the first transistor is configured to receive the first RF signal at its control electrode, and wherein the second passive electrode of the first transistor is coupled to the output of the driver; and a second transistor having a first passive electrode, a second passive electrode, and a control electrode, wherein the second transistor is configured to receive the second RF signal at its control electrode, and wherein the first passive electrode of the first transistor is coupled to the output of the driver.

In accordance with an embodiment of the present invention, the tunable LC circuit further comprises an adjustable capacitor and an inductor coupled in series with one another.

In accordance with an embodiment of the present invention, the first and second transistors further comprise a PMOS transistor and an NMOS transistor, respectively.

In accordance with an embodiment of the present invention, the PMOS transistor further comprises a plurality of PMOS transistors coupled in parallel with one another.

In accordance with an embodiment of the present invention, an apparatus is provided. The apparatus comprises a first driver having an input, an output, and a parasitic capacitance, wherein the input of the first driver is configured to receive complementary first and second RF signals, and wherein there is a free-fly interval between consecutive pulses from the first and second RF signals; a second driver having an input, an output, and a parasitic capacitance, wherein the input of the second driver is configured to receive the first and second RF signals; an first output capacitor that is coupled to the output of the first driver; a second output capacitor that is coupled to the output of the second driver; a matching network that is coupled to each of the first and second output capacitors; and a cancellation circuit that is coupled to the output of at least one of the first and second drivers so as to provide harmonic restoration at least during the free-fly interval.

In accordance with an embodiment of the present invention, the first and second drivers each further comprises: a first transistor having a first passive electrode, a second passive electrode, and a control electrode, wherein the first transistor is configured to receive the first RF signal at its control electrode, and wherein the second passive electrode of the first transistor is coupled to the output of it driver; and a second transistor having a first passive electrode, a second passive electrode, and a control electrode, wherein the second transistor is configured to receive the second RF signal at its control electrode, and wherein the first passive electrode of the first transistor is coupled to the output of it driver.

In accordance with an embodiment of the present invention, the apparatus further comprises: a first switch network that is coupled to the input of the first driver; and a second switch network that is coupled to the input of the second driver.

In accordance with an embodiment of the present invention, the apparatus further comprises: a first switch that is coupled between the cancellation circuit and the output of the first driver; and a second switch that is coupled between the cancellation circuit and the output of the second driver.

In accordance with an embodiment of the present invention, the first and second switches each further comprise an NMOS transistor with a floating body and gate.

In accordance with an embodiment of the present invention, the cancellation circuit further comprises: a first cancellation circuit that is coupled to the output of the first driver; and a second cancellation circuit that is coupled to the output of the second driver.

In accordance with an embodiment of the present invention, an apparatus is provided. The apparatus comprises a plurality of drivers, wherein each driver has an input, an output, and a parasitic capacitance, wherein the input of the each driver is configured to receive complementary first and second RF signals, and wherein there is a free-fly interval between consecutive pulses from the first and second RF signals; a plurality of output capacitor, wherein each output capacitor is coupled to the output of at least one of the drivers; a matching network that is coupled to each of the output capacitors; and a cancellation circuit that is coupled to the output of at least one of the drivers so as to provide harmonic restoration at least during the free-fly interval.

In accordance with an embodiment of the present invention, each drivers further comprises: a first transistor having a first passive electrode, a second passive electrode, and a control electrode, wherein the first transistor is configured to receive the first RF signal at its control electrode, and wherein the second passive electrode of the first transistor is coupled to the output of it driver; and a second transistor having a first passive electrode, a second passive electrode, and a control electrode, wherein the second transistor is configured to receive the second RF signal at its control electrode, and wherein the first passive electrode of the first transistor is coupled to the output of it driver.

In accordance with an embodiment of the present invention, the apparatus further comprises a plurality of switch networks, wherein each switch network is coupled to the input of at least one of the drivers.

In accordance with an embodiment of the present invention, the apparatus further comprises a plurality of switches, wherein each switch is coupled between the cancellation circuit and the output of at least one of the drivers.

In accordance with an embodiment of the present invention, each switch further comprises an NMOS transistor with a floating body and gate.

In accordance with an embodiment of the present invention, the cancellation circuit further comprises a plurality of cancellation circuits, wherein each cancellation circuit is coupled to the output of at least one of the drivers.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3 and 4 are diagrams of a class D PAs;

DETAILED DESCRIPTION

Figure 1:
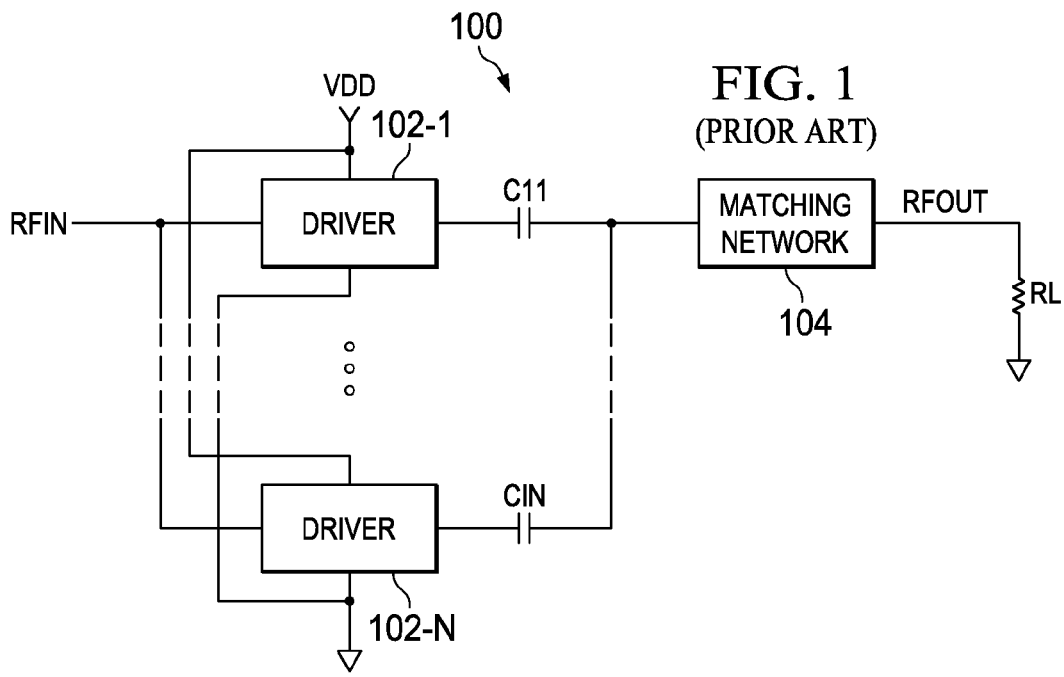
FIG. 1 is a diagram of an example of a conventional class D PA that is capable of amplitude modulation.
Figure 2:
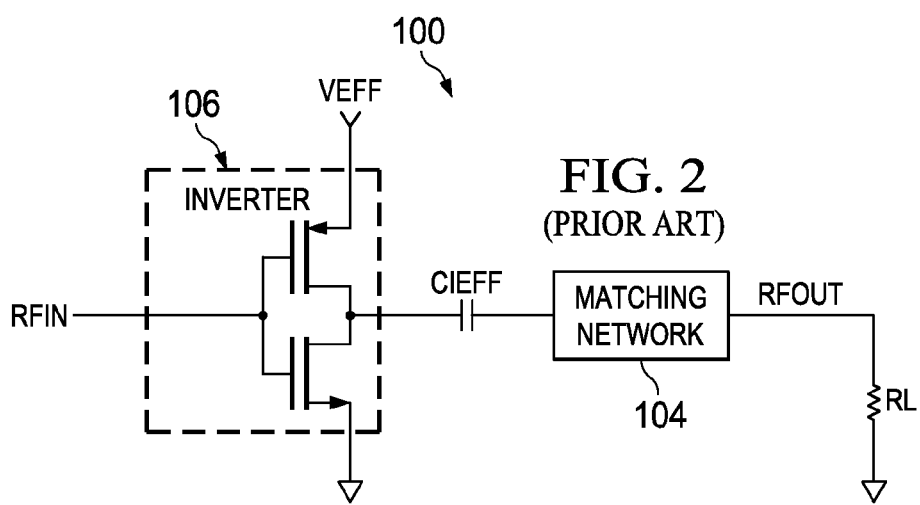
FIG. 2 is a diagram of a functionally equivalent circuit to the PA of FIG. 1.

Refer now to the drawings wherein depicted elements are, for the sake of clarity, not necessarily shown to scale and wherein like or similar elements are designated by the same reference numeral through the several views.

Turning to FIG. 3, an example of a class D PA 200-A in accordance with an embodiment of the present invention can be seen. As shown, PA 200-A is generally comprised of a driver 202-A, a cancellation circuit 204, an output capacitor CO, and a matching network 104. The driver 202-A is generally comprised of transistors Q1 and Q2 (which are typically PMOS and NMOS transistors, respectively), which respectively have parasitic capacitances CP1 and CP2 and which respectively receive RF input signals RFINU and RFIND. The cancellation circuit 204 (which, as shown, is a passive circuit, but may also be an active circuit that may include transistors, synthetic inductors, and the like) generally comprises an adjustable capacitor CC (which can, for example, be a switched capacitor array or a varactor) and an inductor LC that function as a tunable inductor-capacitor (LC) circuit. Also, the matching network 104 generally comprises an inductor LM, capacitor CM1. Matching network 104 may also include parasitic capacitor CM2, and a parasitic resistor RM and a power management network (not shown) having variable matching.

In operation, an RF output signal RFOUT is generated and applied to load RL. The driver 202-A typically receives the input RF signals RFINU and RFIND at its input. This signals RFINU and RFIND are generally complementary pulse width modulated (PWM) input signals that are able to activate transistors Q1 and Q2, but for PA 200-A, these signals are not "adjacent" to one another, meaning that these signals are truly complementary from a timing perspective. Between consecutive pulses of the signals RFINU and RFIND, there is a free-fly or dead time interval, meaning that there is an interval between consecutive activations of transistors Q1 and Q2. Because one of the parasitic capacitances CP1 and CP2 is charged as a result of its transistor Q1 or Q2 being "on," the parasitic capacitor CP1 or CP2 creates distortion when it is discharged during this free-fly interval, which has the effect of reducing the interval. Cancellation circuit 204 can then control the harmonic content at the output of driver 202-A by providing a cancellation current. Typically, the cancellation circuit 204 can be tuned to third-harmonic of the PA 200-A to generate a third-order current, which functions as the cancellation current. Other orders (i.e., fourth, fifth, etc.) or combinations thereof may also be used. Essentially, the cancellation circuit 204 can provide harmonic restoration by shaping the voltage waveform with its provision of the higher order cancellation current during the free-fly interval.

Alternatively, driver 202-A can be modified (as shown in FIG. 4) for class D polar PAs. In the driver 202-B for PA 200-B, transistor Q1 is replaced by transistors Q1-1 to Q1-K, which are coupled in parallel with one another and respectively receive supply voltages VDD-1 to VDD-K. This configuration allows for a dynamic power supply that can be changed or adjusted by controller 206 (which can at least in part function as a decoder for signal RFINU). Additionally, any extra load on the output of driver 202-B can be tuned by can cancellation circuit 204.

Figure 5:
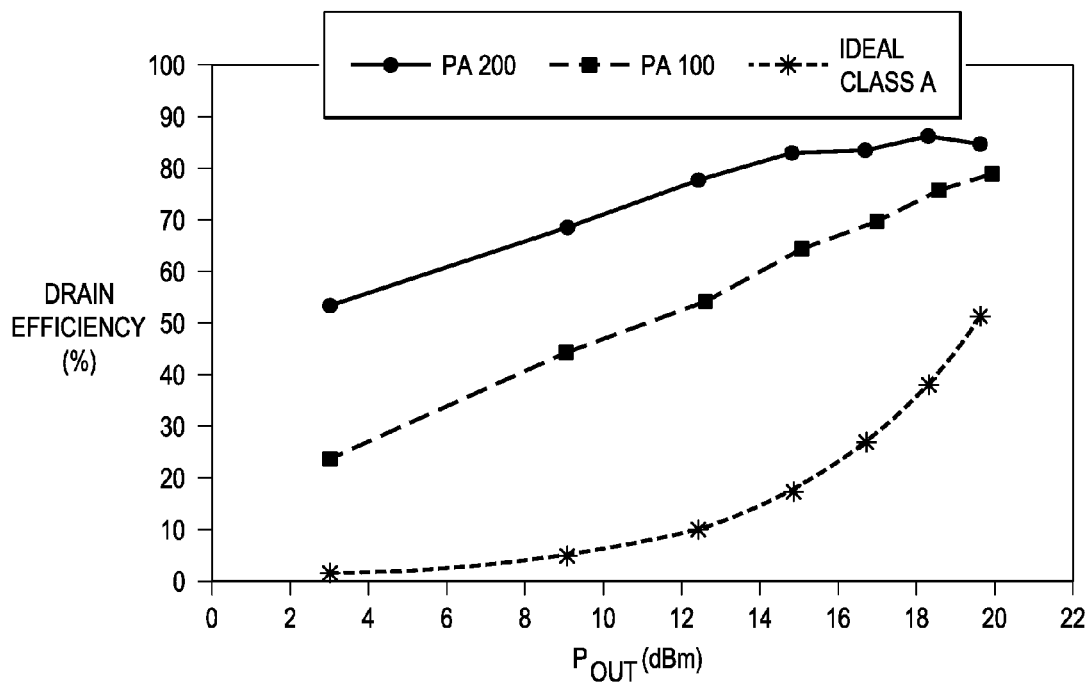
FIG. 5 is a diagram illustrating the efficiency of the PA of FIG. 4.

As a result of using these configurations, the efficiency can be dramatically increased. Namely, the use of the free-fly interval and the cancellation circuit 204 can help to increase efficiency. As shown in FIG. 5, the efficiency of PAs 200-A and 200-B (hereinafter 200) is about 30% better than PA 100 at low output power and narrows to a few percent at high power output.

Figure 6:
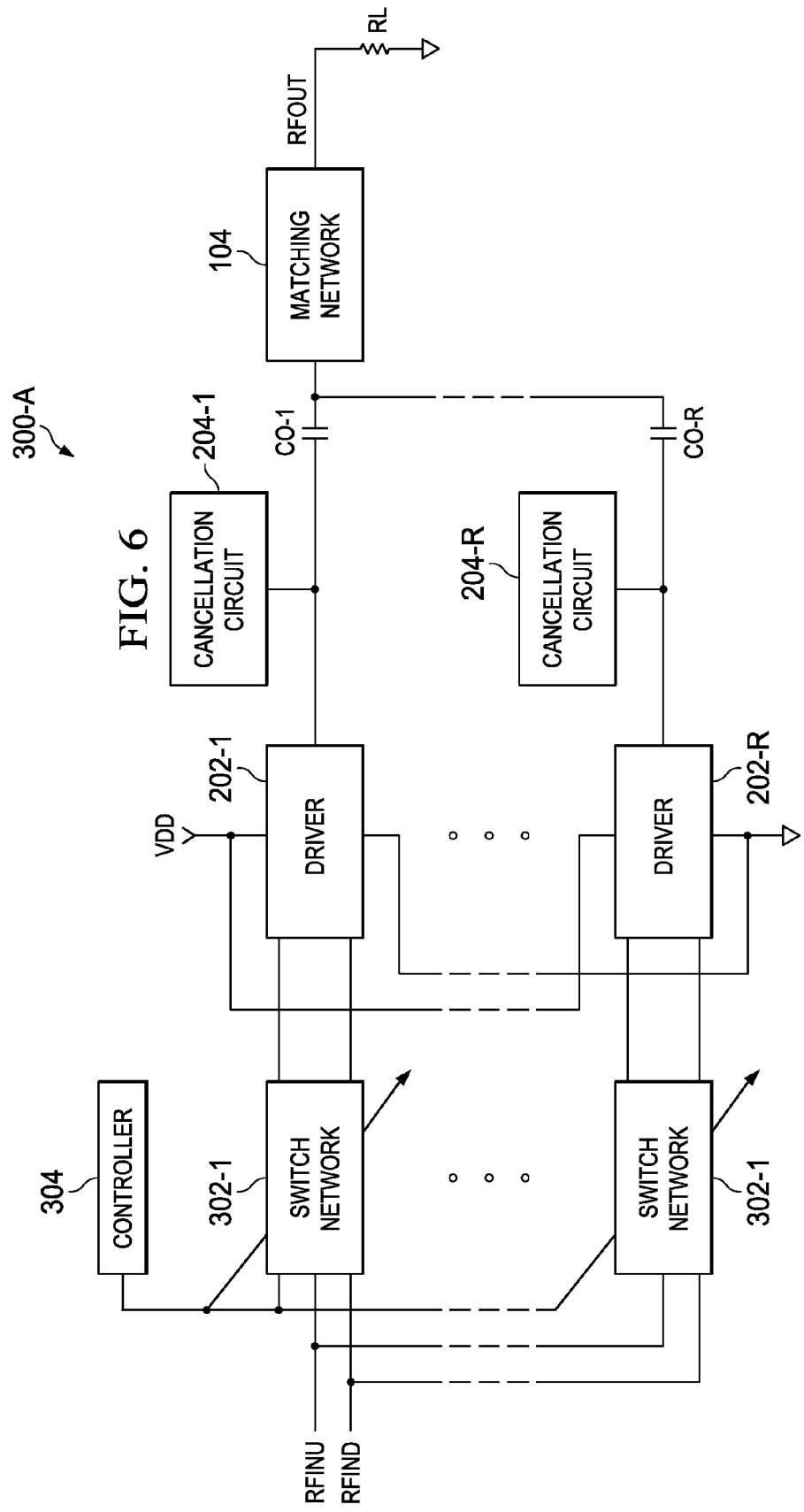
FIG. 6 is a diagram illustrating the use of the PAs of FIGS. 3 and 4 in an adjustable PA.

For many applications, it may also be desirable to provide an amplifier having any adjustable gain. In FIG. 6, an example of an adjustable PA 300-A can be seen. For PA 300-A, there are R branches that are coupled in parallel with one another and are coupled together at an output node. Each of these R branches generally comprises a switch network 302-1 to 302-R, a driver 202-1 to 202-R, a cancellation circuit 204-1 to 204-R, and an output capacitor CO-1 to CO-R. Typically, capacitors CO-1 to CO-R are binarily weighted (i.e., CO-1=C, CO-2=2C, ..., CO-R=$2^{(R-1)}$*C) to provide the desired effect (i.e., adjustable gain), but other alternative arrangements are possible. Depending on the output of controller 304 (which controls the switch networks 302-1 to 302-R), the gain of PA 300-A can be varied depending on which branches are engaged.

As an example, it can be assumed that R is 3, meaning that there are three branches with capacitors CO-1, CO-2, and CO-3 having capacitances, respectively, of C, 2C, and 4C. With this configuration, the controller 304 can provide a 3-bit control signal to switch networks 302-1 to 302-3 so as to provide eight output power levels as shown in the Table 1 below.

TABLE 1

| Control Signal | Level |
|---|---|
| 000 | 0 |
| 100 | 1 |
| 010 | 2 |
| 110 | 3 |
| 001 | 4 |
| 101 | 5 |
| 011 | 6 |
| 111 | 7 |

Figure 7:
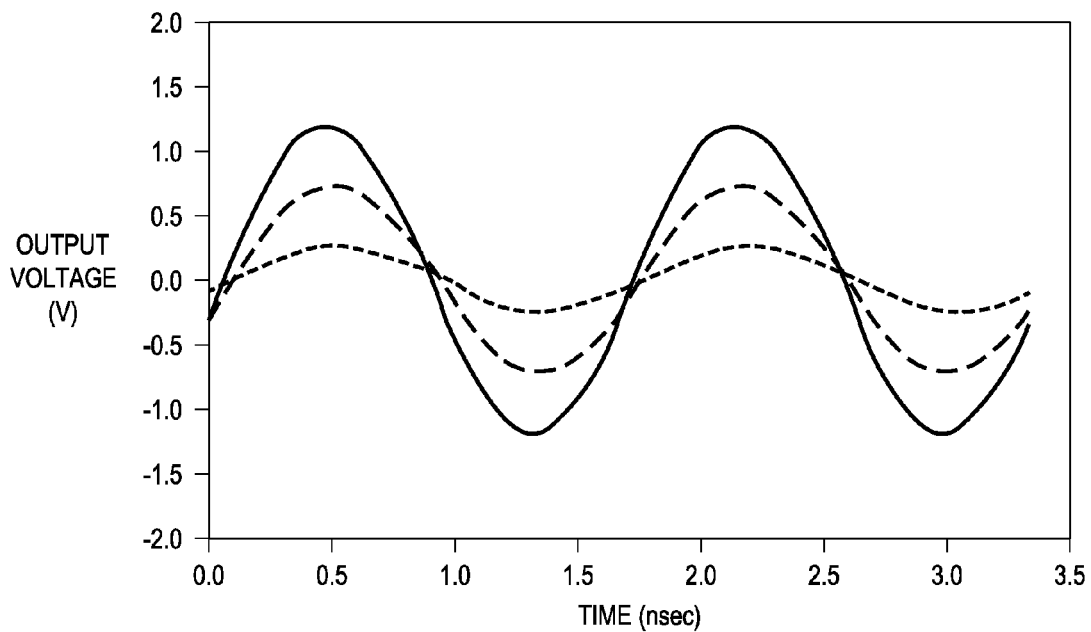
FIG. 7 is a diagram illustrating the function of the PA of FIG. 6.

In FIG. 7, output voltages for levels 1, 3, 5, and 7 can be seen, thus, enabling a user to have an adjustable gain PA 300-A.

Figure 8:
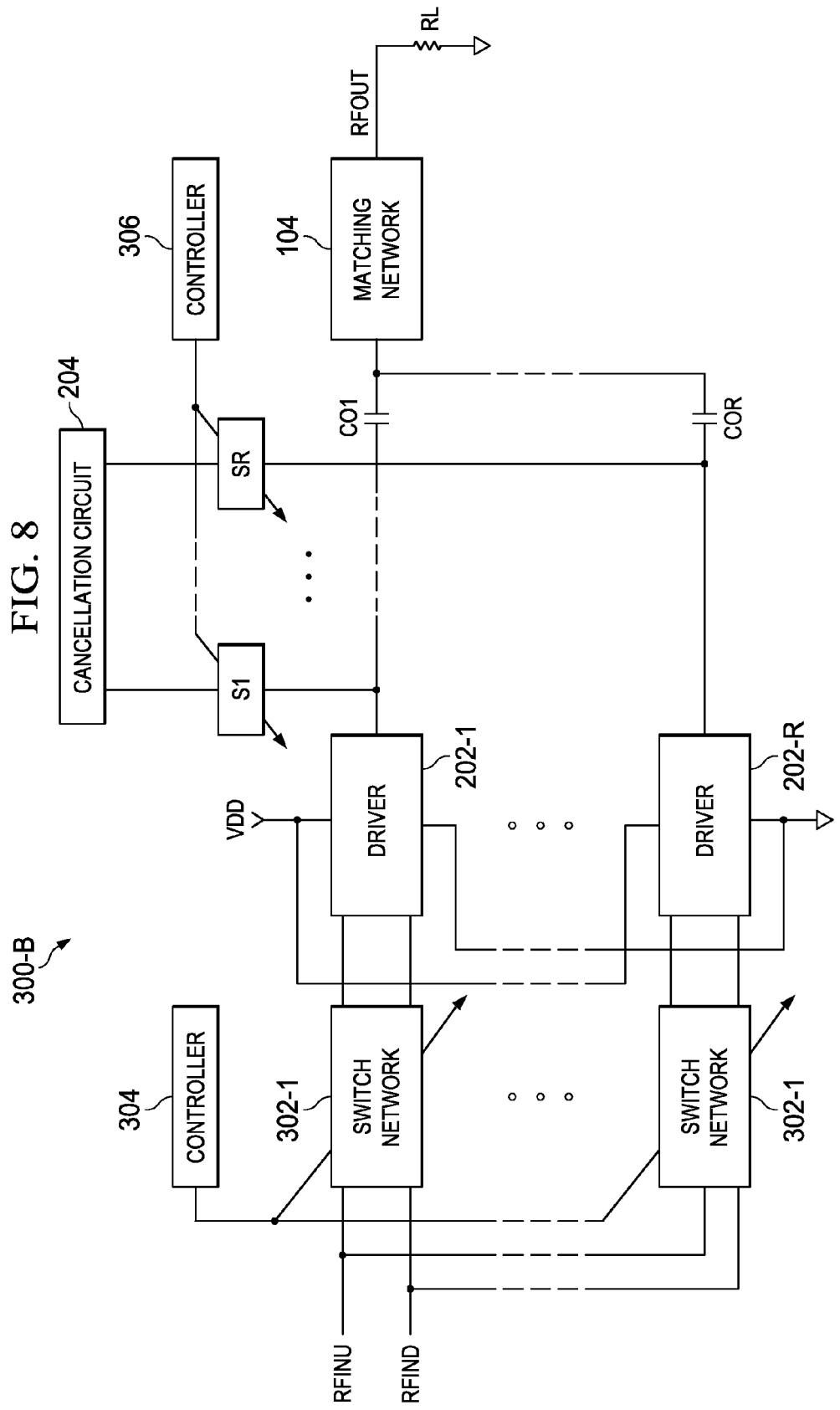
FIG. 8 is a diagram illustrating the use of the PAs of FIGS. 3 and 4 in an adjustable PA.
Figure 9:
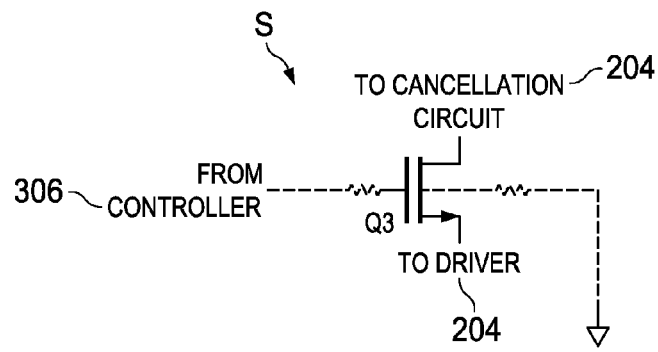
FIG. 9 is a diagram illustrating the switches of FIG. 8.
Figure 10:
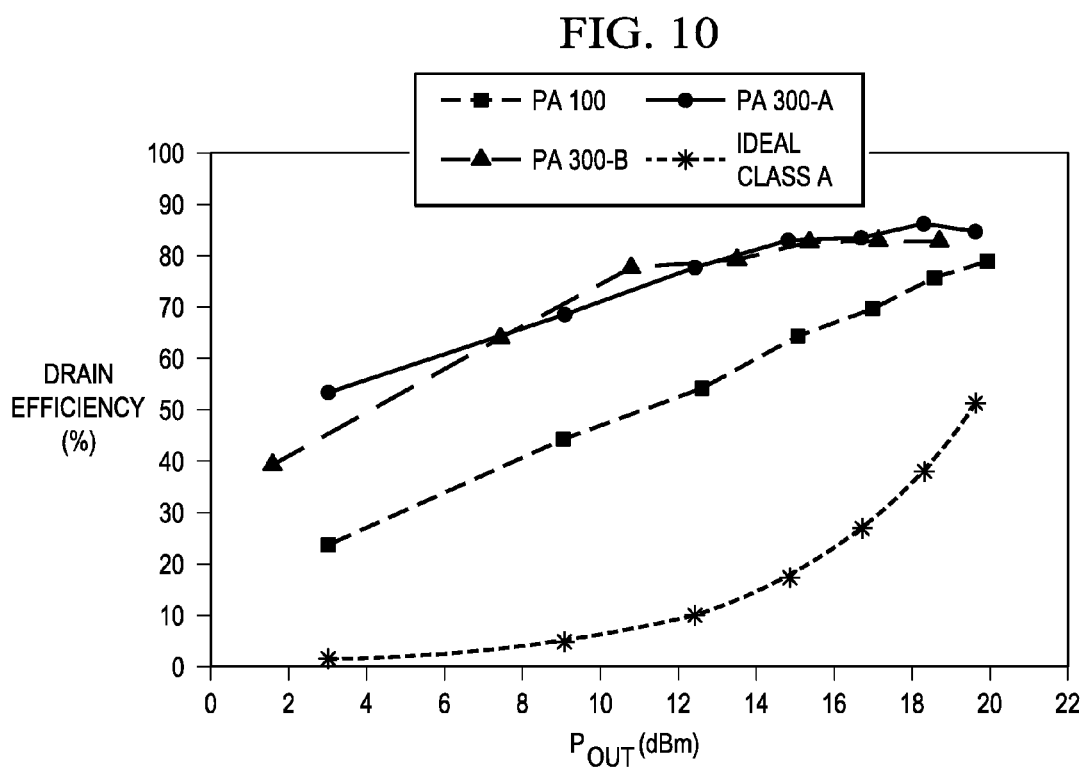
FIG. 10 is a diagram illustrating the efficiency of the PA of FIG. 8.

Turning to FIG. 8, an alternative adjustable PA 300-B. In this configuration, a cancellation circuit 204 is shared among the branches, and switches S1 to SR are employed to couple the cancellation circuit 204 to the outputs of drivers 202-1 to 202-R. These switches S1 to SR (as shown in FIG. 9) are typically transistors Q3 (which can be NMOS or PMOS transistors) that have a floating body and gate. By using the shared configuration of PA 300-B, a significant amount of area can be saved because a single inductor can be used. Additionally, PA 300-B has a higher efficiency (as shown in FIG. 10) in the mid-level power ranges (which is where the majority of the transmitted signals are) than PA 300-A.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
 a driver having an input, an output, and a parasitic capacitance, wherein the input of the driver is configured to receive complementary first and second radio frequency (RF) signals, and wherein there is a free-fly interval between consecutive pulses from the first and second RF signals, and wherein the parasitic capacitance of the driver creates switching losses;
 an output capacitor that is coupled to the output of the driver;
 a matching network that is coupled to the output capacitor; and
 a cancellation circuit that is coupled to the output of the driver so as to provide harmonic restoration at least during the free-fly interval.

2. The apparatus of claim 1, wherein the cancellation circuit is an active circuit.

3. The apparatus of claim 1, wherein the cancellation circuit is a passive circuit.

4. The apparatus of claim 3, wherein the cancellation circuit is a tunable inductor-capacitor (LC) circuit.

5. The apparatus of claim 4, wherein the driver further comprises:
 a first transistor having a first passive electrode, a second passive electrode, and a control electrode, wherein the first transistor is configured to receive the first RF signal at its control electrode, and wherein the second passive electrode of the first transistor is coupled to the output of the driver; and
 a second transistor having a first passive electrode, a second passive electrode, and a control electrode, wherein the second transistor is configured to receive the second RF signal at its control electrode, and wherein the first passive electrode of the first transistor is coupled to the output of the driver.

6. The apparatus of claim 5, wherein the tunable LC circuit further comprises an adjustable capacitor and an inductor coupled in series with one another.

7. The apparatus of claim 6, wherein the first and second transistors further comprise a PMOS transistor and an NMOS transistor, respectively.

8. The apparatus of claim 7, wherein the PMOS transistor further comprises a plurality of PMOS transistors coupled in parallel with one another.

9. An apparatus comprising:
 a first driver having an input, an output, and a parasitic capacitance, wherein the input of the first driver is configured to receive complementary first and second RF signals, and wherein there is a free-fly interval between consecutive pulses from the first and second RF signals;
 a second driver having an input, an output, and a parasitic capacitance, wherein the input of the second driver is configured to receive the first and second RF signals;
 an first output capacitor that is coupled to the output of the first driver;
 a second output capacitor that is coupled to the output of the second driver;
 a matching network that is coupled to each of the first and second output capacitors; and
 a cancellation circuit that is coupled to the output of at least one of the first and second drivers so as to provide harmonic restoration at least during the free-fly interval.

10. The apparatus of claim 9, wherein the cancellation circuit is a passive circuit.

11. The apparatus of claim 10, wherein the cancellation circuit is a tunable LC circuit.

12. The apparatus of claim 11, wherein the first and second drivers each further comprises:
   a first transistor having a first passive electrode, a second passive electrode, and a control electrode, wherein the first transistor is configured to receive the first RF signal at its control electrode, and wherein the second passive electrode of the first transistor is coupled to the output of it driver; and
   a second transistor having a first passive electrode, a second passive electrode, and a control electrode, wherein the second transistor is configured to receive the second RF signal at its control electrode, and wherein the first passive electrode of the first transistor is coupled to the output of it driver.

13. The apparatus of claim 12, wherein the tunable LC circuit further comprises an adjustable capacitor and an inductor coupled in series with one another.

14. The apparatus of claim 13, wherein the first and second transistors further comprise a PMOS transistor and an NMOS transistor, respectively.

15. The apparatus of claim 14, wherein the PMOS transistor further comprises a plurality of PMOS transistors coupled in parallel with one another.

16. The apparatus of claim 14, wherein the apparatus further comprises:
   a first switch network that is coupled to the input of the first driver; and
   a second switch network that is coupled to the input of the second driver.

17. The apparatus of claim 16, wherein the apparatus further comprises:
   a first switch that is coupled between the cancellation circuit and the output of the first driver; and
   a second switch that is coupled between the cancellation circuit and the output of the second driver.

18. The apparatus of claim 17, wherein the first and second switches each further comprise an NMOS transistor with a floating body and gate.

19. The apparatus of claim 16, wherein the cancellation circuit further comprises:
   a first cancellation circuit that is coupled to the output of the first driver; and
   a second cancellation circuit that is coupled to the output of the second driver.

20. An apparatus comprising:
   a plurality of drivers, wherein each driver has an input, an output, and a parasitic capacitance, wherein the input of the each driver is configured to receive complementary first and second RF signals, and wherein there is a free-fly interval between consecutive pulses from the first and second RF signals;
   a plurality of output capacitor, wherein each output capacitor is coupled to the output of at least one of the drivers;
   a matching network that is coupled to each of the output capacitors; and
   a cancellation circuit that is coupled to the output of at least one of the drivers so as to provide harmonic restoration at least during the free-fly interval.

21. The apparatus of claim 20, wherein the cancellation circuit is a passive circuit.

22. The apparatus of claim 21, wherein the cancellation circuit is a tunable LC circuit.

23. The apparatus of claim 22, wherein each driver further comprises:
   a first transistor having a first passive electrode, a second passive electrode, and a control electrode, wherein the first transistor is configured to receive the first RF signal at its control electrode, and wherein the second passive electrode of the first transistor is coupled to the output of it driver; and
   a second transistor having a first passive electrode, a second passive electrode, and a control electrode, wherein the second transistor is configured to receive the second RF signal at its control electrode, and wherein the first passive electrode of the first transistor is coupled to the output of it driver.

24. The apparatus of claim 23, wherein the tunable LC circuit further comprises an adjustable capacitor and an inductor coupled in series with one another.

25. The apparatus of claim 24, wherein the first and second transistors further comprise a PMOS transistor and an NMOS transistor, respectively.

26. The apparatus of claim 24, wherein the PMOS transistor further comprises a plurality of PMOS transistors coupled in parallel with one another.

27. The apparatus of claim 24, wherein the apparatus further comprises a plurality of switch networks, wherein each switch network is coupled to the input of at least one of the drivers.

28. The apparatus of claim 27, wherein the apparatus further comprises a plurality of switches, wherein each switch is coupled between the cancellation circuit and the output of at least one of the drivers.

29. The apparatus of claim 28, wherein each switch further comprises an NMOS transistor with a floating body and gate.

30. The apparatus of claim 27, wherein the cancellation circuit further comprises a plurality of cancellation circuits, wherein each cancellation circuit is coupled to the output of at least one of the drivers.

* * * * *